US012648133B2

(12) United States Patent
Lee et al.

(10) Patent No.: US 12,648,133 B2
(45) Date of Patent: Jun. 2, 2026

(54) NON-VOLATILE MEMORY DEVICE HAVING A PLURALITY OF PASS TRANSISTORS

(71) Applicant: Samsung Electronics Co., Ltd., Suwon-si (KR)

(72) Inventors: Tackhwi Lee, Yongin-si (KR); Jaeduk Lee, Seongnam-si (KR); Hojun Lee, Hwaseong-si (KR); Seongpil Chang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 296 days.

(21) Appl. No.: 17/709,790

(22) Filed: Mar. 31, 2022

(65) Prior Publication Data

US 2023/0019217 A1     Jan. 19, 2023

(30) Foreign Application Priority Data

Jul. 19, 2021    (KR) ........................ 10-2021-0094092

(51) Int. Cl.
*H10B 20/00* (2023.01)
*G11C 16/08* (2006.01)
*G11C 16/12* (2006.01)

(52) U.S. Cl.
CPC ............. *H10B 20/60* (2023.02); *G11C 16/08* (2013.01); *G11C 16/12* (2013.01)

(58) Field of Classification Search
CPC ..... G11C 16/08; G11C 16/12; G11C 16/0483; G11C 16/0441; H10B 43/40; H10B 43/27;
(Continued)

(56) References Cited

U.S. PATENT DOCUMENTS 5,138,420 A * 8/1992 Komori ................ H10D 84/859
257/371
5,945,715 A * 8/1999 Kuriyama .............. H10B 10/00
257/E21.558
(Continued)

FOREIGN PATENT DOCUMENTS

EP         0245515 B1 * 4/1997  ............. H10D 84/00
JP      2000-294658 A    10/2000
(Continued)

OTHER PUBLICATIONS

Office Action for Korean Application No. 10-2021-0094092 dated Jan. 3, 2025.
(Continued)

*Primary Examiner* — Wael M Fahmy
*Assistant Examiner* — Tiberiu Dan Onuta
(74) *Attorney, Agent, or Firm* — Harness, Dickey & Pierce, P.L.C.

(57) ABSTRACT

A non-volatile memory device comprises a memory cell region including a plurality of cell transistors, a first-type semiconductor substrate including a peripheral circuit region including circuits configured to control the plurality of cell transistors, and a plurality of pass transistors on the peripheral circuit region of the semiconductor substrate, wherein the peripheral circuit region includes a first region
(Continued)

and a second region which are doped to a depth at an upper portion of the semiconductor substrate while being insulated from each other by an implant region, wherein the first region is a second type different from the first type, and includes a first doped region, and a first well region beneath the first doped region and configured to have a higher doping concentration than the first doped region, wherein the second region is the first type, and includes a second doped region, and a second well region beneath the second doped region and configured to have a higher doping concentration than the second doped region, wherein a first pass transistor on the first region from among the plurality of pass transistors is connected to a string selection line or a ground selection transistor, wherein a second pass transistor on the second region from among the plurality of pass transistors is connected to a word line, wherein a positive voltage or a negative voltage is configured to be applied to the second well region during operation of the second pass transistor.

20 Claims, 12 Drawing Sheets

(58) Field of Classification Search
CPC ........ H10B 43/30; H10B 41/27; H10B 41/40; H10B 41/30; H10B 20/60
See application file for complete search history.

(56) References Cited

U.S. PATENT DOCUMENTS

| | | | |
|---|---|---|---|
| 7,447,064 | B1 | 11/2008 | Bu et al. |
| 9,754,948 | B2 | 9/2017 | Dhaoui et al. |
| 9,830,989 | B2 | 11/2017 | Shinagawa et al. |
| 2007/0201299 | A1 | 8/2007 | Kanda et al. |
| 2015/0138892 | A1 | 5/2015 | Kim |
| 2017/0069386 | A1 | 3/2017 | Song et al. |
| 2021/0175243 | A1* | 6/2021 | Shin .................... G11C 16/0483 |
| 2022/0246632 | A1* | 8/2022 | Shimane ................. H01L 24/80 |

FOREIGN PATENT DOCUMENTS

| | | | |
|---|---|---|---|
| KR | 100211183 | B1 | 7/1999 |
| KR | 100882989 | B1 | 2/2009 |
| KR | 101519595 | B1 | 5/2015 |
| KR | 10-2017-0030697 | A | 3/2017 |
| KR | 10-2021-0070472 | A | 6/2021 |

OTHER PUBLICATIONS

Notice of Allowance in Korean Application No. 10-2021-0094092 dated Jul. 22, 2025.

* cited by examiner

NON-VOLATILE MEMORY DEVICE HAVING A PLURALITY OF PASS TRANSISTORS

CROSS-REFERENCE TO THE RELATED APPLICATION

This application claims priority from Korean Patent Application No. 10-2021-0094092, filed on Jul. 19, 2021, in the Korean Intellectual Property Office, the disclosure of which is incorporated herein by reference in its entirety.

BACKGROUND

1. Field

Example embodiments of the disclosure relate to a non-volatile memory device including a pass transistor.

2. Description of the Related Art

Non-volatile memory includes read-only memory (ROM), programmable ROM (PROM), electrically-programmable ROM (EPROM), electrically-erasable programmable ROM (EEPROM), flash memory, phase-change random access memory (PRAM), magnetic RAM (MRAM), resistive RAM (RRAM), ferroelectric RAM (FRAM), etc.

In accordance with advances of semiconductor manufacturing technology, attempts to realize non-volatile memory with a three-dimensional structure are being conducted. The three-dimensional structure may provide an increased number of memory cells while using the same chip area, as compared to a two-dimensional structure. However, the non-volatile memory with the three-dimensional structure may have problems in that process difficulty is higher, as compared to the two-dimensional structure, and unintentional noise may be generated.

In particular, when the threshold voltage of a pass transistor varies, there may be a problem in that an output voltage of the pass transistor is considerably low, as compared to an input voltage to the pass transistor. The threshold voltage of the pass transistor may be varied under particular conditions due to a body effect of a semiconductor substrate itself.

SUMMARY

Example embodiments of the disclosure provide a non-volatile memory device configured to reduce or minimize variation of the threshold voltage of a pass transistor caused by a body effect.

According to some example embodiments, a non-volatile memory device is provided. The non-volatile memory device comprises a memory cell region including a plurality of cell transistors, a first-type semiconductor substrate including a peripheral circuit region including circuits configured to control the plurality of cell transistors, and a plurality of pass transistors on the peripheral circuit region of the semiconductor substrate, wherein the peripheral circuit region includes a first region and a second region which are doped to a predetermined or alternatively, desired depth at an upper portion of the semiconductor substrate while being insulated from each other by an implant region, wherein the first region is a second type different from the first type, and includes a first doped region, and a first well region beneath the first doped region and configured to have a higher doping concentration than the first doped region, wherein the second region is the first type, and includes a second doped region, and a second well region beneath the second doped region and configured to have a higher doping concentration than the second doped region, wherein a first pass transistor on the first region from among the plurality of pass transistors is connected to a string selection line or a ground selection transistor, wherein a second pass transistor on the second region from among the plurality of pass transistors is connected to a word line, wherein a positive voltage or a negative voltage is configured to be applied to the second well region during operation of the second pass transistor.

According to some example embodiments, a non-volatile memory device is provided. The non-volatile memory device comprises a memory cell array including a plurality of memory blocks, and a row decoder block connected to the plurality of memory blocks via a ground selection line, a word line and a string selection line, wherein the row decoder block includes a semiconductor substrate, a first pass transistor on a first region of the semiconductor substrate and connected to the ground selection line, a second pass transistor on a second region of the semiconductor substrate and connected to the word line, and a third pass transistor on a third region of the semiconductor substrate and connected to the string selection line, wherein each of the first region, the second region, and the third region is a region doped to a predetermined or alternatively, desired depth from a top surface of the semiconductor substrate, wherein the first region, the second region, and the third region are insulated from one another by an implant region at the semiconductor substrate, wherein the implant region includes a side wall region surrounding a side wall of each of the first region, the second region and the third region, and a deep well region surrounding a bottom surface of each of the first region, the second region and the third region, wherein the second region includes a doped region, and a well region doped beneath the doped region in a higher concentration than the doped region, wherein a positive voltage or a negative voltage is configured to be applied to the well region.

According to some example embodiments, a non-volatile memory device is provided. The non-volatile memory device comprises a memory cell array including a plurality of memory blocks, and a row decoder block connected to the plurality of memory blocks via a ground selection line, a word line, a dummy word line and a string selection line, wherein the row decoder block includes a semiconductor substrate, a first pass transistor on a first region of the semiconductor substrate and connected to the ground selection line, a second pass transistor on a second region of the semiconductor substrate and connected to the word line or the dummy word line, and a third pass transistor on a third region of the semiconductor substrate and connected to the string selection line, wherein each of the first region, the second region, and the third region is a region doped to a predetermined or alternatively, desired depth from a top surface of the semiconductor substrate, wherein the semiconductor substrate includes a side wall region surrounding a side wall of each of the first region, the second region and the third region, and a deep well region surrounding a bottom surface of each of the first region, the second region and the third region, wherein the implant region is a region doped in a predetermined or alternatively, desired concentration, and insulates the first region, the second region and the third region from one another, wherein the first region includes a first doped region, and a first well region doped beneath the first doped region in a higher concentration than the first doped region, wherein the second region includes a second doped region, and a second well region doped beneath the second doped region in a higher concentration than the second doped region, wherein a voltage signal having a lower level than an input voltage signal of the second pass transistor is configured to be applied to the second well region via a contact extending through the second doped region.

BRIEF DESCRIPTION OF THE DRAWINGS

FIG. 4 is a view showing a physical structure of one cell structure.

FIG. 6 is a schematic cross-sectional view of the peripheral circuit region and the memory cell region of FIGS. 1 and 2.

DETAILED DESCRIPTION OF EXAMPLE EMBODIMENTS

Figure 1:
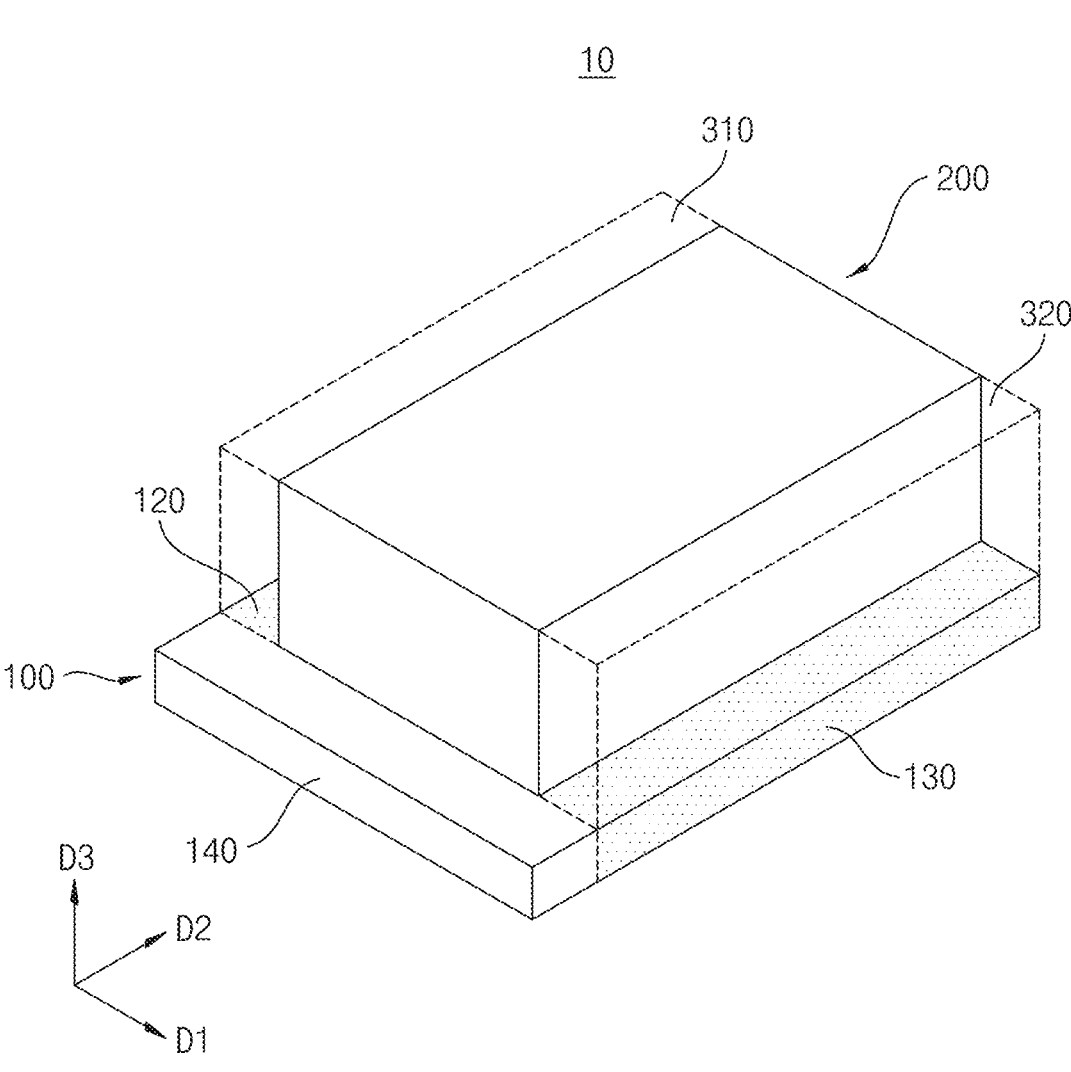
FIG. 1 is a view schematically showing a part of constituent elements of a non-volatile memory device according to example embodiments of the disclosure.

FIG. 1 is a view schematically showing a part of constituent elements of a non-volatile memory device according to example embodiments of the disclosure.

Referring to FIG. 1, a non-volatile memory device 10 may include a peripheral circuit region 100 and a memory cell region 200 which are formed in a semiconductor substrate and/or on the semiconductor substrate. In example embodiments, the memory cell region 200 may have the form of a plate parallel to a plane formed in a first direction D1 and a second direction D2. The memory cell region 200 may be mounted on a top surface of the peripheral circuit region 100, for example, a plane in a third direction D3.

Figure 2:
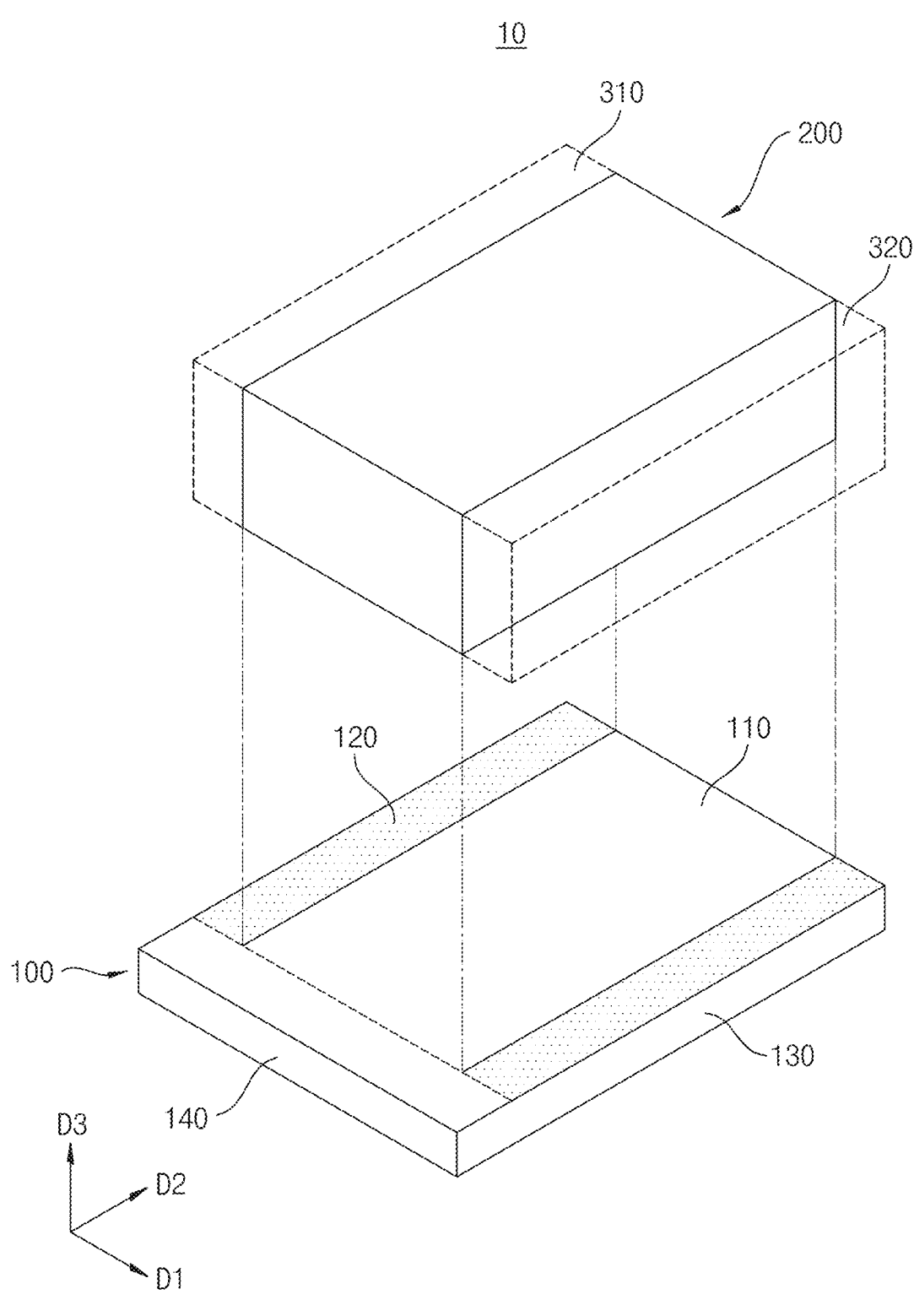
FIG. 2 is a view showing the non-volatile memory device of FIG. 1 in a state in which the peripheral circuit region and the memory cell region are separated from each other in the third direction.

FIG. 2 is a view showing the non-volatile memory device of FIG. 1 in a state in which the peripheral circuit region and the memory cell region are separated from each other in the third direction.

Referring to FIGS. 1 and 2, the memory cell region 200 may occupy a portion of the top surface of the peripheral circuit region 100. The peripheral circuit region 100 may include a buried region 110 having an upper portion covered by the memory cell region 200, and a first exposed region 120, a second exposed region 130 and/or a third exposed region 140 which have top portions not covered by the memory cell region 200, respectively.

The memory cell region 200 may include a plurality of cell transistors. The plurality of cell transistors may be used as one of memory cells written with data, dummy memory cells written with dummy data, and a select transistor to select or not to select the memory cells or the dummy memory cells for writing or reading.

A first wiring region 310, in which first wirings to interconnect the memory cell region 200 and the peripheral circuit region 100 are disposed, may be provided over the first exposed region 120. In addition, a second wiring region 320, in which second wirings to interconnect the memory cell region 200 and the peripheral circuit region 100 are disposed, may be provided over the second exposed region 130.

That is, the memory cell region 200 may be electrically connected to the peripheral circuit region 100 via the first wirings of the first wiring region 310 and the second wirings of the second wiring region 320 at opposite side surfaces of the memory cell region 200.

The buried region 110 of the peripheral circuit region 100 may be embodied to include circuits for controlling various operations of the non-volatile memory device 10. The first exposed region 120 of the peripheral circuit region 100 may be embodied to include circuits to control the cell transistors of the memory cell region 200 via the first wirings. The second exposed region 130 of the peripheral circuit region 100 may be embodied to include circuits to control the cell transistors of the memory cell region 200 via the second wirings.

The third exposed region 140 of the peripheral circuit region 100 may be embodied to include circuits to communicate with an external device, and wirings and pads to communicate with the external device.

Figure 3:
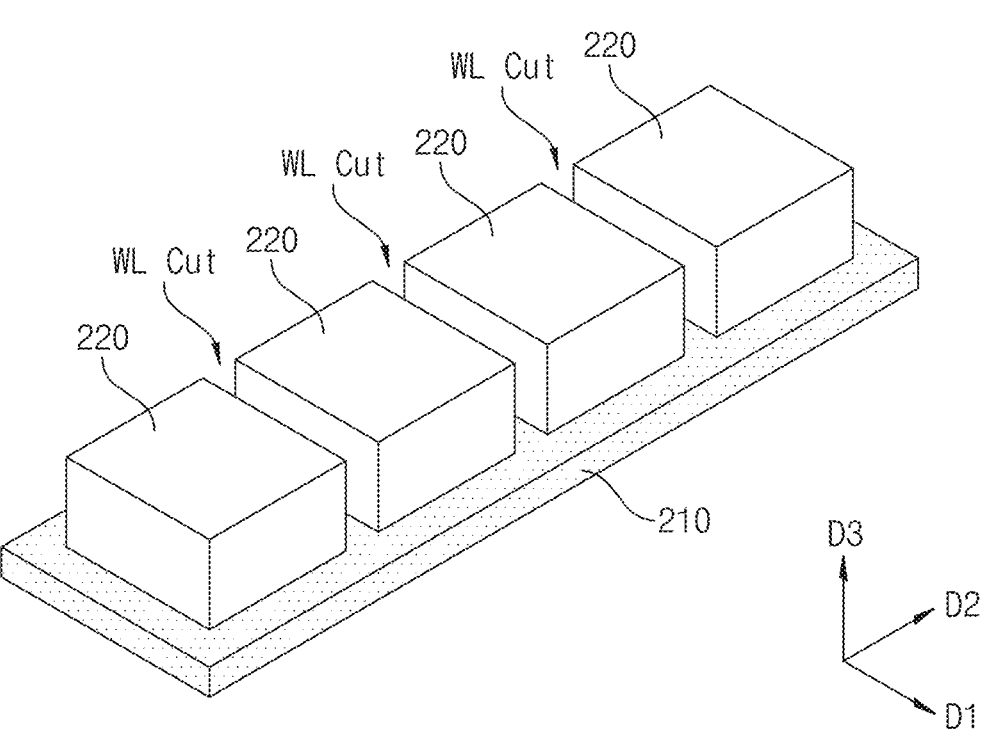
FIG. 3 is a view showing a structure of the memory cell region shown in FIGS. 1 and 2.

FIG. 3 is a view showing a structure of the memory cell region shown in FIGS. 1 and 2.

Referring to FIGS. 1 to 3, the memory cell region 200 may include a common source plate 210 parallel to a plane in the first direction D1 and the second direction D2, and a plurality of cell structures 220 disposed on the common source plate 210 while being spaced apart from one another in the second direction D2.

The common source plate 210 may be provided in common at the plurality of cell structures 220. The common source plate 210 may transfer voltages to the plurality of cell structures 220. For example, the common source plate 210 may include silicon doped with P-type or N-type impurities.

A space separating the plurality of cell structures 220 from one another may be referred to as a "word line cut WL Cut". The plurality of cell structures 220 may have the same structure. Each of the plurality of cell structures 220 may include cell strings arranged in the first direction D1 and the second direction D2. Each of the cell strings may include cell transistors stacked in the third direction D3.

The plurality of cell structures 220 may form memory blocks. For example, each memory block may include one or more cell structures 220. The memory block may represent a group of cell transistors which are commonly managed. Various voltages may be simultaneously applied to cell transistors belonging to the same memory block in a write or read operation.

Figure 4:
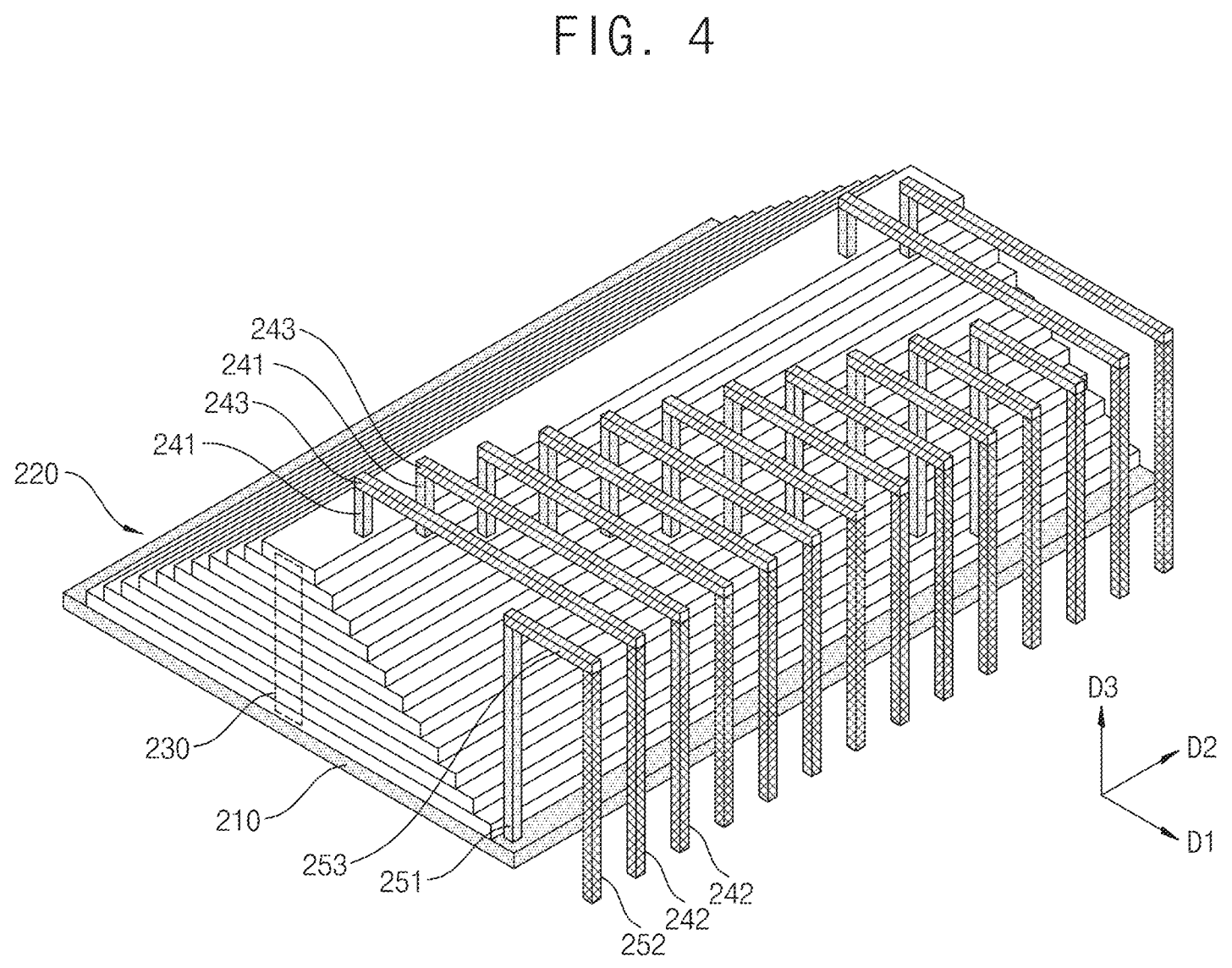

FIG. 4 is a view showing a physical structure of one cell structure.

Referring to FIGS. 1 to 4, a cell structure 220 having the form of a staircase may be disposed over the common source plate 210. The cell structure 220 may include a plurality of layers having upper surfaces (for example, top surfaces in the third direction D3) with areas gradually reduced as the cell structure 220 extends in the third direction D3.

The cell structure 220 may include a channel region 230. The channel region 230 may be disposed at a central portion (for example, a central portion in the first direction D1) of the cell structure 220. The channel region 230 may be included in common in the plurality of layers of the cell structure 220. In the channel region 230, cell transistors may be embodied in each of the plurality of layers, respectively.

Each of the plurality of layers of the cell structure 220 may be connected to the peripheral circuit region 100 via wirings. Illustratively, an example of the second wirings corresponding to the second exposed region 130 and the second wiring region 320 is shown in FIG. 4. The first wirings symmetrical to the second wirings shown in FIG. 4 may be provided at the first exposed region 120 and the first wiring region 310. In FIG. 4, only the second wirings are shown in order to prevent the drawing from being unnecessarily complicated.

The second wirings may include cell vias 241, through vias 242, and/or conductive materials 243. The cell vias 241 may extend from the plurality of layers of the cell structure 220 in the third direction D3, respectively. The through vias 242 may extend from the second wiring region 320 in the third direction D3. The through vias 242 extend to the peripheral circuit region 100 and, as such, may be electrically connected to constituent elements of the peripheral circuit region 100.

The conductive materials 243 may electrically interconnect the cell vias 241 and the through vias 242, respectively. The conductive materials 243 may be embodied as metal wirings disposed on a metal wiring layer. Illustratively, each of an uppermost one of the layers of the cell structure 220 and the layer just below the outermost layer may be connected to two wirings.

In accordance with example embodiments, the second wirings may further include at least one wiring connected to the common source plate 210. The at least one wiring may include a first via 251 extending from the common source plate 210 in the third direction D3, a second via 252 extending from the second wiring region 320 in the third direction D3, and a conductive material 253 electrically interconnecting the first via 251 and the second via 252. In some example embodiments, the conductive material 253 may be embodied as metal wirings disposed on a metal wiring layer. In accordance with example embodiments, the second wirings may include a wiring to bias the common source plate 210.

Figure 5:
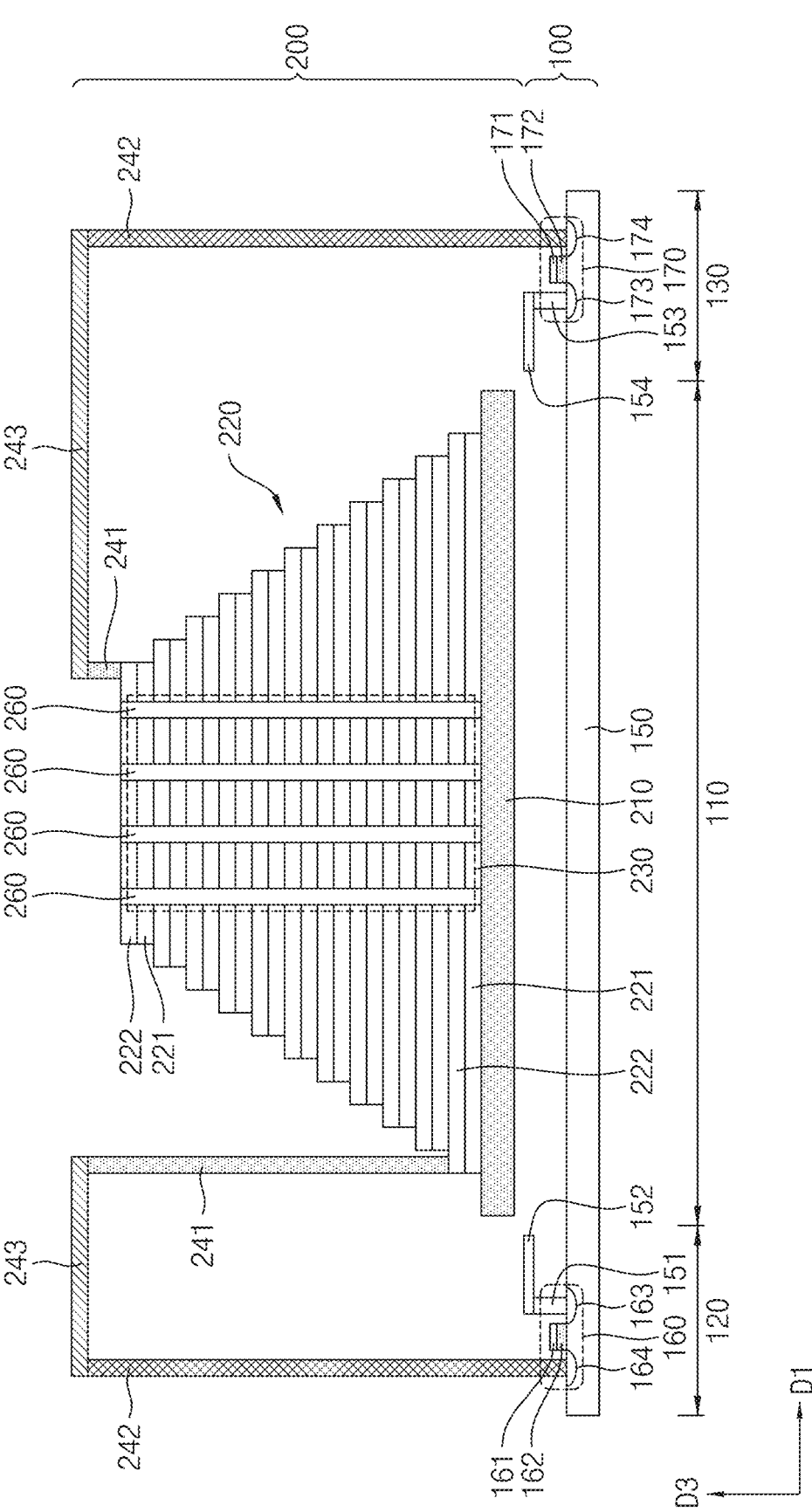
FIG. 5 is a schematic cross-sectional view of the peripheral circuit region and the memory cell region of FIGS. 1 and 2.

FIG. 5 is a schematic cross-sectional view of the peripheral circuit region and the memory cell region of FIGS. 1 and 2.

Illustratively, a cross-sectional view taken in the first direction D1 and the third direction D3 is shown in FIG. 5 in association with the wirings, corresponding to an upper layer portion and a lower layer portion of the cell structure, from among the first wirings and the second wirings.

Referring to FIGS. 1 to 5, the peripheral circuit region 100 may include an active region 150, and devices 160 and 170 on the active region 150. The active region 150 may be formed on the semiconductor substrate. The devices 160 and

170 may be first and second transistors 160 and 170 connected to the through vias 242 of the first and second wirings.

The active region 150 may include the above-described buried region 110, the above-described first exposed region 120, and/or the above-described second exposed region 130.

The first transistor 160 may be formed in the first exposed region 120 and/or the second exposed region 130. The first transistor 160 may include a gate 161, an insulating film 162, a first junction 163, and/or a second junction 164. The second transistor 170 may include a gate 171, an insulating film 172, a first junction 173, and/or a second junction 174.

The first junction 163 of the first transistor 160 may be connected to a first peripheral circuit via 151. The first peripheral circuit via 151 may be connected to another constituent element of the peripheral circuit region 100 via a metal wiring 152. The second junction 164 of the first transistor 160 may be connected to the through via 242. The cell via 241, which is electrically connected to the first transistor 160, may be connected to the lower layer portion of the cell structure.

The second transistor 170 may be formed on the first exposed region 120 and/or the second exposed region 130. The first junction 173 of the second transistor 170 may be connected to a second peripheral circuit via 153. The second peripheral circuit via 153 may be connected to another constituent element of the peripheral circuit region 100 via a metal wiring 154. The second junction 174 of the second transistor 170 may be connected to the through via 242. The cell via 241, which is electrically connected to the second transistor 170, may be connected to the upper layer portion of the cell structure.

In example embodiments, the first transistor 160 may be connected to a ground selection line GSL, which will be described later with reference to FIG. 7. In example embodiments, the second transistor 170 may be connected to string selection lines SSL, which will be described later with reference to FIG. 7.

Illustratively, only the constituent elements, directly connected to the first transistor 160, the second transistor 170 and the through vias 242, from among the constituent elements of the peripheral circuit region 100 are shown in FIG. 5. However, additional constituent elements not shown in FIG. 5 may be added to the peripheral circuit region 100.

The memory cell region 200 may include the common source plate 210 on the buried region 110, and the cell structure 220 on the common source plate 210. The cell structure 220 may have a structure in which pairs of an insulating structure 221 and a conductive layer 222 are sequentially stacked on the common source plate 210 in the third direction D3.

Vertical channels 260 may extend through the cell structure 220 in the third direction D3 in the channel region 230. The vertical channels 260 may form cell transistors (for example, including memory cells, dummy memory cells, and select transistors) stacked in the third direction D3, together with the cell structure 220.

The cell structure 220 may have the form of a staircase having a width in the first direction D1 gradually reduced as the cell structure 220 extends in the third direction D3. Illustratively, an information storage film including a silicon oxide film, a silicon nitride film and a silicon oxide film may be formed between the cell structure 220 and the vertical channels 260.

The conductive layers 222 of the cell structure 220 may extend in the first direction D1 and, as such, may electrically interconnect the cell transistors. The conductive layers 222 of the cell structure 220 may be biased via corresponding ones of the cell vias. The cell transistors may be biased in common through the same cell via in each layer of the cell structure 220.

Each of the through vias 242 may extend from the second junction 164 or 174 of the first transistor 160 or the second transistor 170 in the third direction D3. Illustratively, portions, at which no constituent is present, of the peripheral circuit region 100 and the memory cell region 200 may be filled with an insulating material. The through vias 242 may extend through both the insulating material of the peripheral circuit region 100 and the insulating material of the memory cell region 200.

When the non-volatile memory device 10 operates, a high voltage (for example, 20 V or more) may be applied to the conductive layers 222. The first transistor 160 and the second transistor 170 may be embodied as a high-voltage transistor withstanding a high voltage. The first transistor 160 and the second transistor 170 may be referred to as "pass transistors" in terms of transfer of a high voltage.

The number of pass transistors required in one cell structure 220 may be varied in accordance with the structure of the cell structure 220 and connection relations of wirings.

Illustratively, the vertical channels 260 is shown in FIG. 5 as being viewed through a cross-section corresponding to the cell vias 241 and the through vias 242 connected to the upper and lower layer portions of the cell structure 220. However, when the positions of the vertical channels 260 are misaligned from the cross-section corresponding to the cell vias 241 and the through vias 242 connected to the uppermost layer of the cell structure 220, the vertical channels 260 cannot be viewed or only portions of the vertical channels 260 can be viewed.

In addition, although four vertical channels 260 are shown in FIG. 5 as being present in the channel region 230, the number of vertical channels 260 present in the channel region 230 or embodied in the channel region 230 is not limited thereto. Although the cell structure 220 is shown in FIG. 5 as having 11 layers, the number of layers of the cell structure 220 is not limited thereto.

In order to prevent the drawing from being unnecessarily complicated, constituent elements associated with the vertical channels 260 are not shown in FIG. 5.

Figure 6:
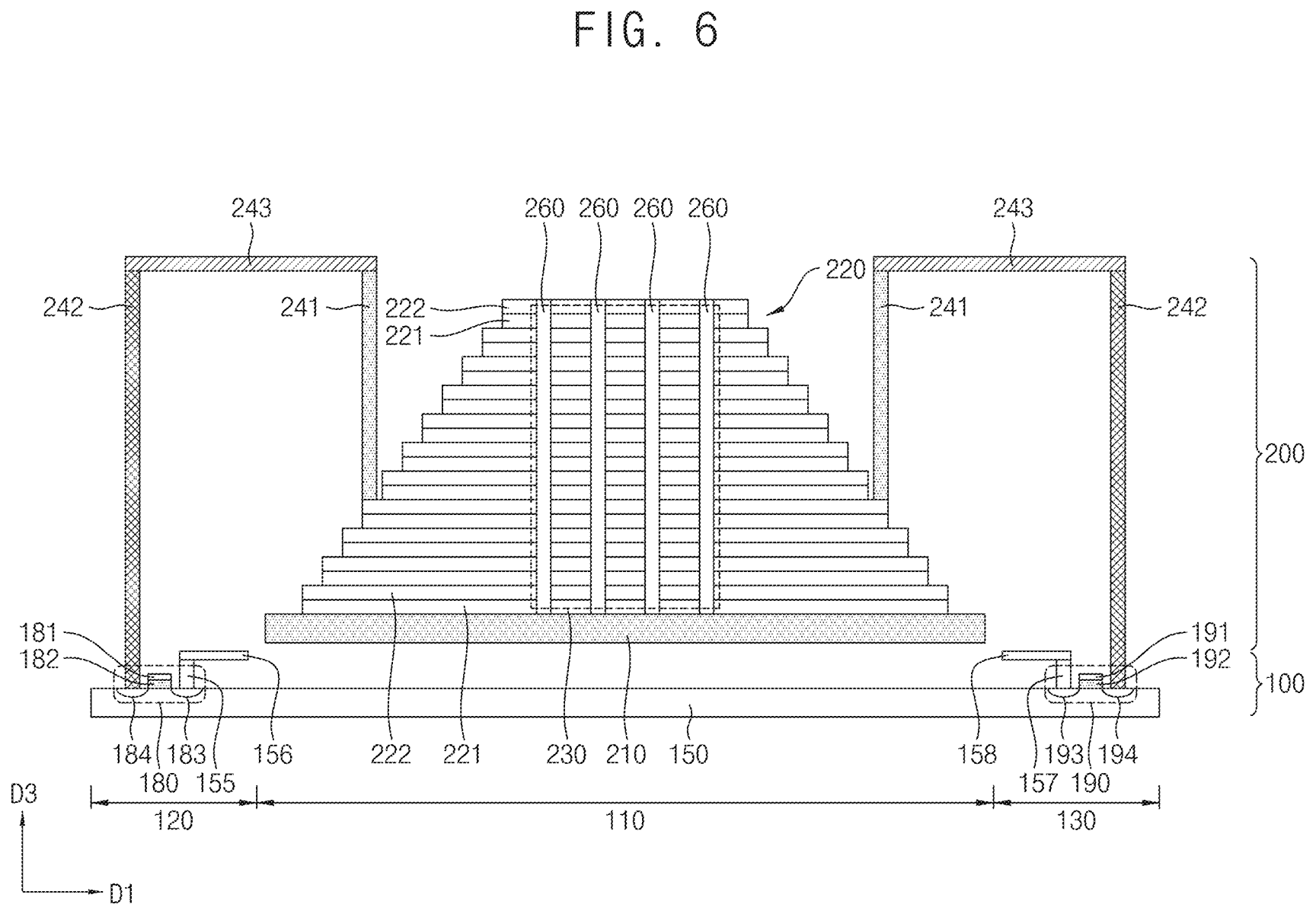

FIG. 6 is a schematic cross-sectional view of the peripheral circuit region and the memory cell region of FIGS. 1 and 2.

Illustratively, a cross-sectional view taken in the first direction D1 and the third direction D3 is shown in FIG. 6 in association with the wirings, corresponding to a middle layer portion of the cell structure, from among the first wirings and the second wirings.

Referring to FIGS. 1 to 6, the peripheral circuit region 100 may include an active region 150, and devices 180 and 190 on the active region 150. The active region 150 may be formed on the semiconductor substrate. The devices 180 and 190 may be third and fourth transistors 180 and 190 connected to the through vias 242 of the first and second wirings.

The third transistor 180 may be formed in the first exposed region 120 and/or the second exposed region 130. The third transistor 180 may include a gate 181, an insulating film 182, a first junction 183, and/or a second junction 184. The fourth transistor 190 may include a gate 191, an insulating film 192, a first junction 193, and/or a second junction 194.

The first junction 163 of the third transistor 180 may be connected to a third peripheral circuit via 155. The third peripheral circuit via 155 may be connected to another constituent element of the peripheral circuit region 100 via a metal wiring 156. The second junction 184 of the third transistor 180 may be connected to the through via 242.

The fourth transistor 190 may be formed on the first exposed region 120 and/or the second exposed region 130. The first junction 193 of the fourth transistor 190 may be connected to a fourth peripheral circuit via 157. The fourth peripheral circuit via 157 may be connected to another constituent element of the peripheral circuit region 100 via a metal wiring 158. The second junction 194 of the fourth transistor 190 may be connected to the through via 242.

In example embodiments, the third transistor 180 may be connected to word lines WL1 to WL8, which will be described later with reference to FIG. 7. Although not clearly shown, the fourth transistor 190 may be connected to dummy word lines.

Illustratively, only the constituent elements, directly connected to the third transistor 180, the fourth transistor 190 and the through vias 242, from among the constituent elements of the peripheral region 100 are shown in FIG. 6. However, additional constituent elements not shown in FIG. 6 may be added to the peripheral circuit region 100.

The memory cell region 200 may include a common source plate 210, and a cell structure 220 on the common source plate 210. The cell structure 220 may have the same structure as described with reference to FIG. 5. Accordingly, no overlapping description will be given.

Each of the through vias 242 may extend from the second junction 184 or 194 of the third transistor 180 or the fourth transistor 190 in the third direction D3. Illustratively, portions, at which no constituent is present, of the peripheral circuit region 100 and the memory cell region 200 may be filled with an insulating material. The through vias 242 may extend through both the insulating material of the peripheral circuit region 100 and the insulating material of the memory cell region 200.

The third transistor 180 and the fourth transistor 190 may be embodied as pass transistors and, as such, may be included in an array of the pass transistors described with reference to FIG. 5.

Illustratively, arrays of pass transistors including the third transistor 180 and the fourth transistor 190 may be disposed in the first exposed region 120 and the second exposed region 130, respectively.

Illustratively, vertical channels 260 are shown in FIG. 6 as being viewed through a cross-section corresponding to the cell vias 241 and the through vias 242 connected to the lower layer portion of the cell structure 220. However, when the positions of the vertical channels 260 are misaligned from the cross-section corresponding to the cell vias 241 and the through vias 242, the vertical channels 260 cannot be viewed or only portions of the vertical channels 260 can be viewed. In some example embodiments, a part of the cell vias 241 may be connected to the common source plate 210.

In order to prevent the drawing from being unnecessarily complicated, constituent elements associated with the vertical channels 260 are not shown in FIG. 6.

As described with reference to FIGS. 5 and 6, the memory cell region 200 may be embodied on the peripheral circuit region 100 configured to control the memory cell region 200. This structure may be referred to as cell-over-peri (COP). Of course, example embodiments of the disclosure are not limited to cell-over-peri (COP).

Figure 7:
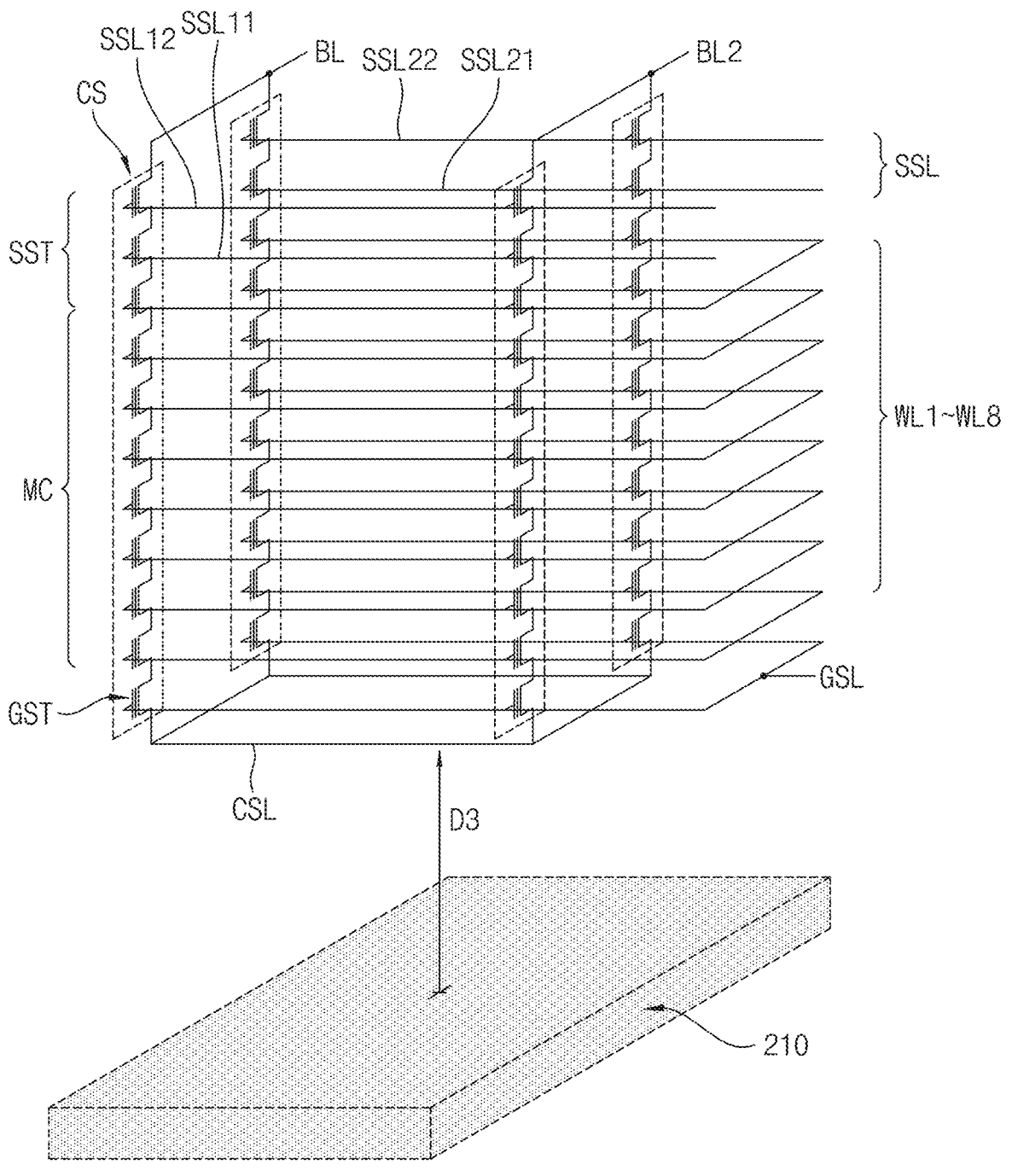
FIG. 7 is a schematic circuit diagram corresponding to the channel region of FIGS. 5 and 6.

FIG. 7 is a schematic circuit diagram corresponding to the channel region of FIGS. 5 and 6.

Referring to FIGS. 5 to 7, four vertical channels 260 may form four cell strings CS.

For example, cell transistors corresponding to a lower layer portion (for example, the lower layer portion of the cell structure in FIG. 5) may be used as ground selection transistors GST. The lower layer portion may include a ground selection line GSL connected in common to the ground selection transistors GST.

For example, cell transistors corresponding to a middle layer portion (for example, the middle layer portion of the cell structure in FIG. 6) may be used as memory cells MC. The middle layer portion may include first to eighth word lines WL1 to WL8. Each of the first to eighth word lines WL1 to WL8 may be connected in common to memory cells MC of the layer corresponding thereto.

For example, cell transistors corresponding to an upper layer portion (for example, the upper layer portion of the cell structure in FIG. 5) may be used as string selection transistors SST. The upper layer portion may include eleventh to twenty-second string selection lines SSL11, SSL12, SSL21 and SSL22.

A common source plate 210 may be used as a common source line CSL connected in common to the cell strings CS. In accordance with example embodiments, the common source plate 210 may be biased to a ground voltage or a positive voltage or a negative voltage having a level similar to that of the ground voltage in a read operation, and may be biased to a positive high voltage in an erase operation.

Figure 8:
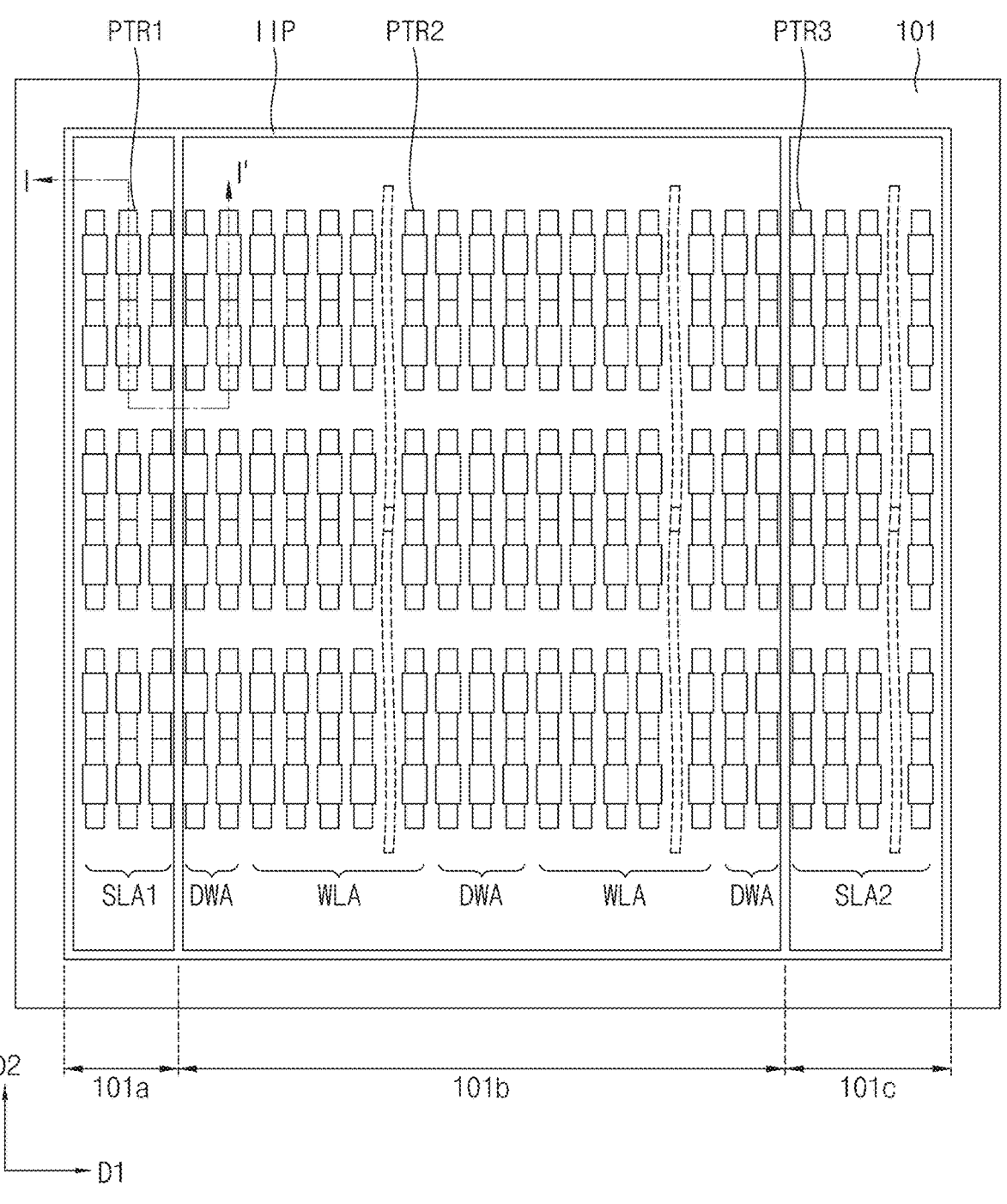
FIG. 8 is a plan view schematically showing the first exposed region or the second exposed region of FIGS. 1 and 2.
Figure 9:
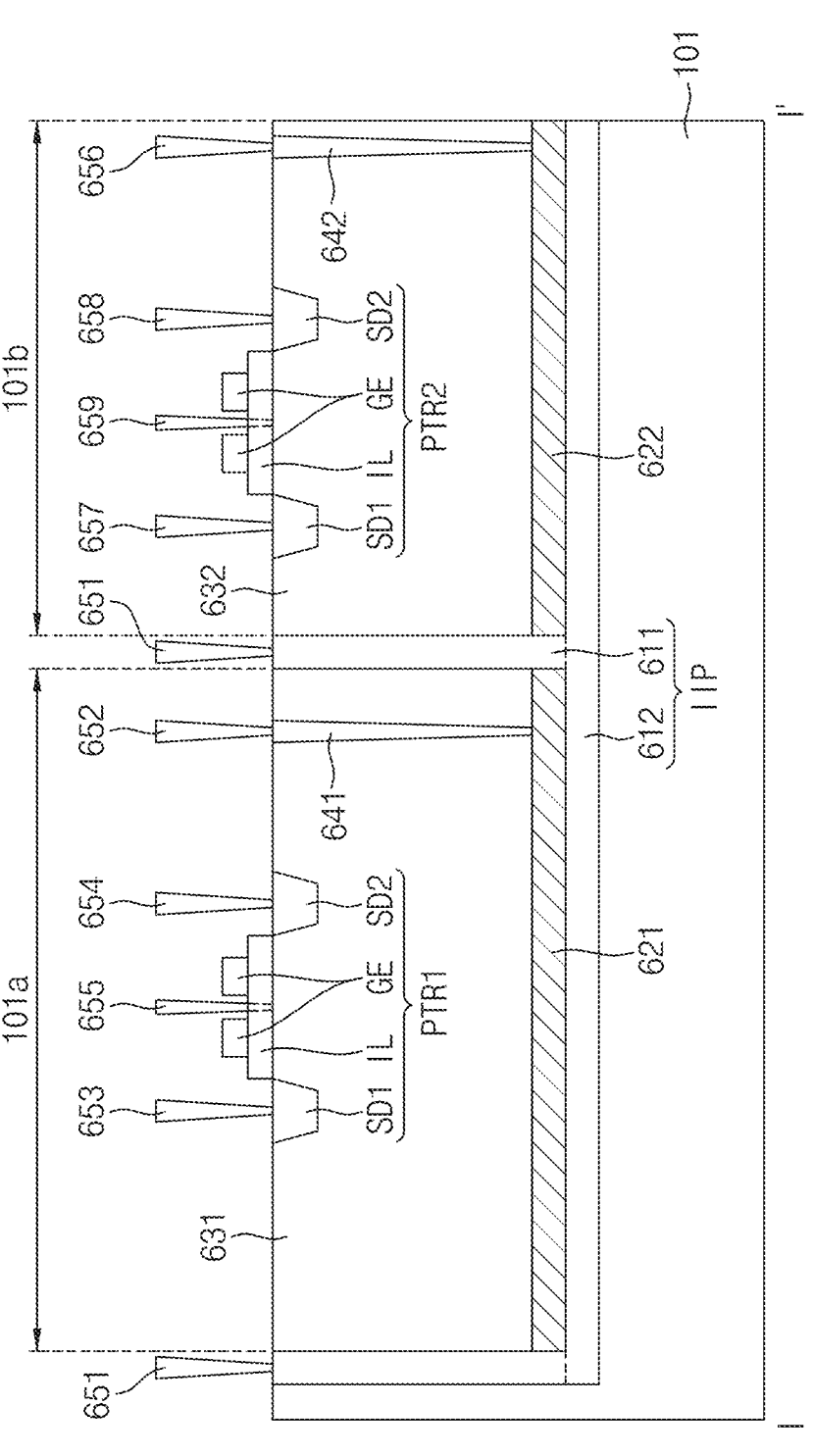
FIG. 9 is a schematic cross-sectional view taken along line I-I' in FIG. 8.

FIG. 8 is a plan view schematically showing the first exposed region or the second exposed region of FIGS. 1 and 2. FIG. 9 is a schematic cross-sectional view taken along line I-I' in FIG. 8.

The following description will be given with reference to the first exposed region 120, and no overlapping description will be given because the second exposed region 130 has the same shape as the first exposed region 120 or a symmetrical shape to that of the first exposed region 120.

Referring to FIGS. 1 to 9, the first exposed region 120 (and the second exposed region 130) may include first to third regions 101a, 101b and 101c divided from one another at a semiconductor substrate 101. In example embodiments, a P-type silicon substrate may be used as the semiconductor substrate 101. Each of the first to third regions 101a, 101b and 101c may be a region doped with N-type or P-type impurities to a predetermined, or alternatively, desired depth from a top surface of the semiconductor substrate 101.

For example, the first region 101a may be a region in which first pass transistors PTR1 connected to a ground selection line GSL are disposed. The second region 101b may be a region in which second pass transistors PTR2 connected to word lines or dummy word lines are disposed. The third region 101c may be a region in which third pass transistors PTR3 connected to string selection lines SSL are disposed.

The second region 101b may be disposed between the first region 101a and the third region 101c. In example embodiments, the first region 101a, the second region 101b, and the third region 101c may be arranged in a first direction D1.

The first region 101a, the second region 101b, and the third region 101c may be divided from one another by an implant region IIP. In example embodiments, the implant region IIP may be a region doped through excessive implantation of atoms in the semiconductor substrate 101, as compared to regions therearound. For example, the implant region IIP may be doped using B atoms or the like in the case of P type, and may be doped using P or As atoms or the like in the case of N type.

For example, the implant region IIP may be an N-type region. For example, when a P-type silicon substrate is used as the semiconductor substrate 101, the implant region IIP may be P type.

For example, the implant region IIP may have a structure formed to a predetermined or alternatively, desired depth from a top surface of the semiconductor substrate 101 (for example, a so-called fish cage structure). The implant region IIP may include a side wall region 611 and a deep well region 612. The deep well region 612 may be a bottom surface of the implant region IIP. The side wall region 611 may be a vertical side wall formed from the deep well region 612 in a third direction D3.

The implant region IIP may include a function for insulating two regions divided from each other under the condition that the implant region IIP is interposed therebetween. In example embodiments, the implant region IIP may insulate the first region 101a and the second region 101b, which are disposed adjacent to each other, from each other. In addition, the implant region IIP may insulate the second region 101b and third region 101c, which are disposed adjacent to each other, from each other. For example, each side surface of the first region 101a, the second region 101b and the third region 101c may be surrounded by the side wall region 611. Bottom surfaces of the first region 101a, the second region 101b and the third region 101c may be surrounded by the deep well region 612. Each of the first region 101a, the second region 101b and the third region 101c may be surrounded by the side wall region 611 and the deep well region 612 of the implant region IIP. The side wall region 611 of the implant region IIP may be disposed between the first region 101a and the second region 101b and between the second region 101b and the third region 101c.

In example embodiments, the side wall region 611 of the implant region IIP may be connected to an implant connection via 651, to which a voltage is externally supplied.

In the first region 101a, a first well region 621 may be directly disposed on the deep well region 612 of the implant region IIP. A first doped region 631 may be disposed on the first well region 621. That is, the first region 101a may include the first doped region 631 and the first well region 621.

The type of the first well region 621 may be identical to the type of the first doped region 631. The doping concentration of the first well region 621 may be higher than the doping concentration of the first doped region 631. For example, when the first doped region 631 is an N-type region doped in a low concentration, the first well region 621 may be an N type region doped in a high concentration.

A first contact 641 may be formed in the first region 101a in order to provide external electric power to the first well region 621. The first contact 641 may extend through the first doped region 631 and, as such, may contact the first well region 621. In example embodiments, an external voltage may be supplied to the first well region 621 via the first contact 641. The first contact 641 may be connected to a second via 652, to which an external voltage is supplied. In example embodiments, when the non-volatile memory device 10 operates, a positive voltage or a negative voltage, which is not 0 V, may be supplied to the first well region 621.

A first pass transistor PTR1 may be disposed on the first region 101a. The first pass transistor PTR1 may have a type different from that of the first doped region 631 and the first well region 621. For example, when the first doped region 631 and the first well region 621 are N type, the first pass transistor PTR1 formed on the first region 101*a* may be a PMOS transistor.

The first pass transistor PTR1 may correspond to the first transistor 160 described above with reference to FIGS. 5 and 6. The first pass transistor PTR1 may include a gate GE, an insulating film IL, a first junction SD1, and/or a second junction SD2. For example, the first junction SD1 of the first pass transistor PTR1 may be connected to a first peripheral circuit via 653. The second junction SD2 of the first pass transistor PTR1 may be connected to a first through via 654. One channel region of the first pass transistor PTR1 may be connected to an input via 655, to which a voltage signal is supplied.

For example, during operation of the first pass transistor PTR1, an input voltage signal may be applied to the first junction SD1 via the first peripheral circuit via 653, and an output voltage signal may be output to the first through via 654 via the second junction SD2.

In the second region 101*b*, a second well region 622 may be directly disposed on the deep well region 612 of the implant region IIP. A second doped region 632 may be disposed on the second well region 622. That is, the second region 101*b* may include the second doped region 632 and the second well region 622.

The type of the second well region 622 may be identical to the type of the second doped region 632. The doping concentration of the second well region 622 may be higher than the doping concentration of the second doped region 632.

In example embodiments, the second region 101*b* may be a region of a type different from that of the first region 101*a*. That is, the type of the second well region 622 and the second doped region 632 may be different from the type of the first well region 621 and the first doped region 631. For example, when the first region is an N-type region, the second doped region 632 may be a P-type region doped in a low concentration, and the second well region 622 may be a P-type region doped in a high concentration.

A second contact 642 may be formed in the second region 101*b* in order to supply external electric power to the second well region 622. The second contact 642 may extend through the second doped region 632 and, as such, may contact the second well region 622. In example embodiments, an external voltage may be supplied to the second well region 622 via the second contact 642. The second contact 642 may be connected to a third via 656, to which an external voltage is supplied. In example embodiments, when the non-volatile memory device 10 operates, a positive voltage or a negative voltage, which is not 0 V, may be supplied to the second well region 622.

A second pass transistor PTR2 may be disposed on the second region 101*b*. The second pass transistor PTR2 may have a type different from that of the second doped region 632 and the second well region 622. For example, when the second doped region 632 and the second well region 622 are P type, the second pass transistor PTR2 formed on the second region 101*b* may be an NMOS transistor.

The second pass transistor PTR2 may correspond to the third transistor 180 and/or the fourth transistor 190 described above with reference to FIGS. 5 and 6. The second pass transistor PTR2 may include a gate GE, an insulating film IL, a first junction SD1, and/or a second junction SD2. For example, the first junction SD1 of the second pass transistor PTR2 may be connected to a second peripheral circuit via 657. The second junction SD2 of the second pass transistor PTR2 may be connected to a second through via 658. One channel region of the second pass transistor PTR2 may be connected to an input via 659, to which a voltage signal is supplied.

For example, during operation of the second pass transistor PTR2, an input voltage signal may be applied to the first junction SD1 via the second peripheral circuit via 657, and an output voltage signal may be output to the second through via 658 via the second junction SD2.

A part of second pass transistors PTR2 may be connected to word lines WL1 to WL8, and another part of the second pass transistors PTR2 may be connected to dummy word lines. The second region 101*b* may include a region (for example, WLA) where the second pass transistors PTR connected to the word lines WL1 to WL8 are disposed, and a region (for example, DWA) where the second pass transistors PTR2 connected to the dummy word lines are disposed.

In example embodiments the third region 101*c* may be a region of a type different from that of the second region 101*b* while being identical to that of the first region 101*a*. A third pass transistor PTR3 may be disposed on the third region 101*c*. The third pass transistor PTR3 may have a type different from that of the third region 101*c*.

For example, when the third region 101*c* is N type, the third pass transistor PTR3 formed on the third region 101*c* may be a PMOS transistor. In example embodiments, the third region 101*c* may include a third doped region and a third well region which are disposed at positions corresponding to those of the doped region and the well region in the first region 101*a* or the second region 101*b*, respectively. No overlapping description of the third doped region and the third well region will be given.

The third pass transistor PTR3 may correspond to the second transistor 170 described above with reference to FIGS. 5 and 6. Although not clearly shown, the third pass transistor PTR3 may include a gate, an insulating film, a first junction, and a second junction.

In example embodiments, when the non-volatile memory device 10 operates, a positive voltage or a negative voltage may be supplied to each of the first well region 621, the second well region 622 and the third well region. For example, during operation of the first pass transistor PTR1, a positive voltage or a negative voltage may be supplied to the first well region 621. For example, during operation of the second pass transistor PTR2, a positive voltage or a negative voltage may be supplied to the second well region 622. For example, during operation of the third pass transistor PTR3, a positive voltage or a negative voltage may be supplied to the third well region. Here, the positive voltage or the negative voltage means a voltage other than a voltage of 0 V and a ground voltage.

In example embodiments, during operation of the first pass transistor PTR1, the voltage level of a voltage signal supplied to the first well region 621 may not be higher than the voltage level of an input voltage signal of the first pass transistor PTR1. During operation of the second pass transistor PTR2, the voltage level of a voltage signal supplied to the second well region 622 may not be higher than the voltage level of an input voltage signal of the second pass transistor PTR2. During operation of the third pass transistor PTR3, the voltage level of a voltage signal supplied to the third well region may not be higher than the voltage level of an input voltage signal of the third pass transistor PTR3.

In accordance with example embodiments, the period in which a voltage signal is supplied to the second well region may be different from the period in which a voltage signal is supplied to the first well region or the third well region. For example, the period in which the second pass transistor PTR2 operates may be different from the period in which the first pass transistor PTR1 and the third pass transistor PTR3 operate.

In example embodiments, the implant region IIP may receive a voltage signal having the same voltage level as the voltage supplied to the first well region, the second well region and the third well region via the implant connection via 651.

In accordance with example embodiments, when the non-volatile memory device 10 operates, a ground voltage (for example, 0 V) may be supplied to the semiconductor substrate 101.

In other example embodiments, the second region 101b may be a region of the same type as the first region 101a and the third region 101c.

Figure 10B:
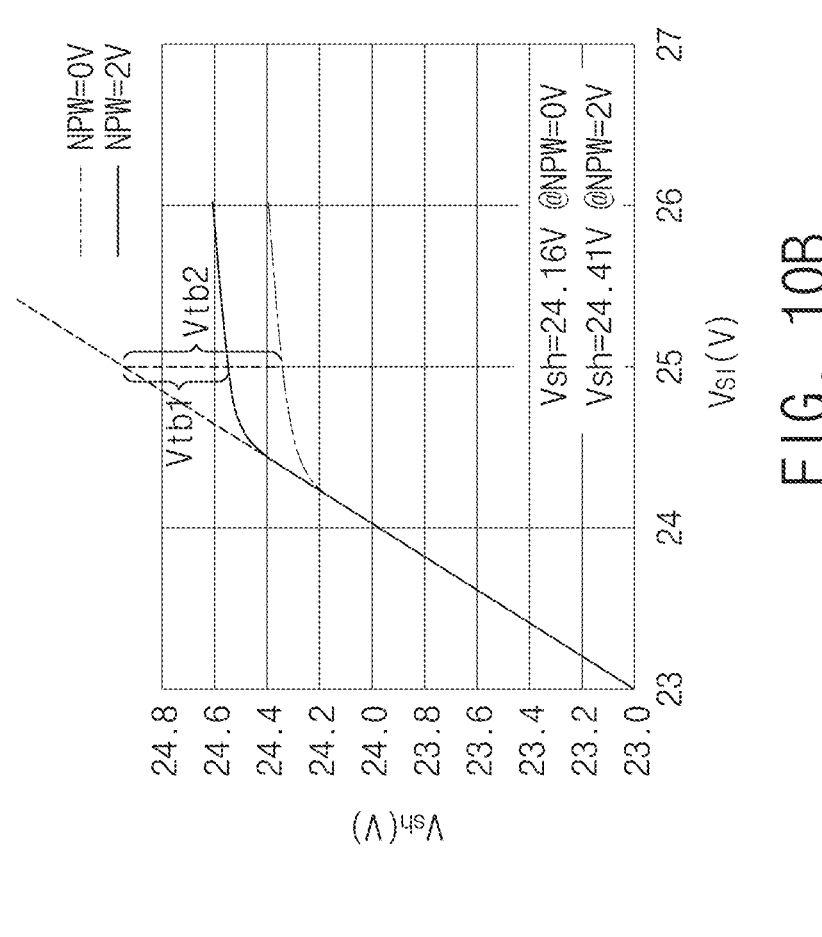
FIGS. 10A and 10B are graphs explaining effects of example embodiments of the disclosure in accordance with one experimental example.
Figure 10A:
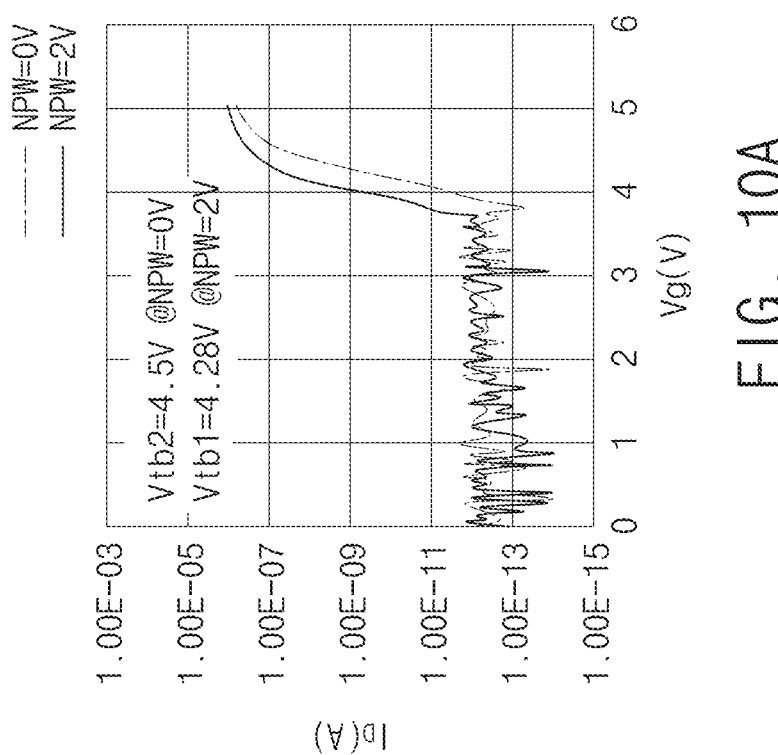

FIGS. 10A and 10B are graphs explaining effects of example embodiments of the disclosure in accordance with one experimental example.

FIGS. 10A and 10B illustrate a measured value for the second pass transistor PRT2 of the second region 101b. A graph of FIG. 10A depicts measurement results of drive current ID versus a gate voltage Vg, for measurement of threshold voltage variations Vtb1 and Vtb2 caused by body effects exhibited when voltages of 0 V (NPW=0 V) and 2 V (NPW=2 V) are applied to the second well region 622. A graph of FIG. 10B depicts an output voltage Vsh versus an input voltage Vsi of the second pass transistor PTR2 when voltages of 0 V (NPW=0 V) and 2 V (NPW=2 V) are applied to the second well region 622.

Referring to FIGS. 8 to 10, when a positive or negative voltage is supplied to the second well region 622, the body effect of the second region 101b itself may be reduced and, as such, variation in the threshold voltage of the second pass transistor PTR2 may be reduced. For example, when a positive voltage is supplied to the second well region 622, the threshold voltage of the second pass transistor PTR2 may be slightly varied in a negative direction, whereas, when a negative voltage is supplied to the second well region 622, the threshold voltage of the second pass transistor PTR2 may be slightly varied in a positive direction.

In the experimental example, a body effect is reduced when a voltage of 0 V is supplied to the second well region 622 and, as such, variation in the threshold voltage of the second pass transistor PTR2 is measured to be about 4.5 V, whereas, when a voltage of 2 V is supplied to the second well region 622, a body effect is reduced and, as such, variation in the threshold voltage of the second pass transistor PTR2 is measured to be about 4.28 V.

In the experimental example, when a bias of 25 V is applied to the second transistor PTR2 in a state in which a voltage of 0 V is supplied to the second well region 622, an output voltage of the second pass transistor PTR2 is measured to be about 24.41 V, whereas a bias of 25 V is applied to the second transistor PTR2 in a state in which a voltage of 2 V is supplied to the second well region 622, an output voltage of the second pass transistor PTR2 is measured to be about 24.16 V. Here, the output voltage of the second pass transistor PTR2 may be proportional to a voltage supplied to the word line.

Referring to FIGS. 8 to 10, even when a voltage of 0 V (or a different voltage) is supplied to the first well region 621 of the first region 101a adjacent to the second region 101b, a positive voltage (for example, 2 V) or a negative voltage may be supplied to the second well region 622 because the second region 101b is insulated from the first region 101a by the implant region IIP.

Figure 11:
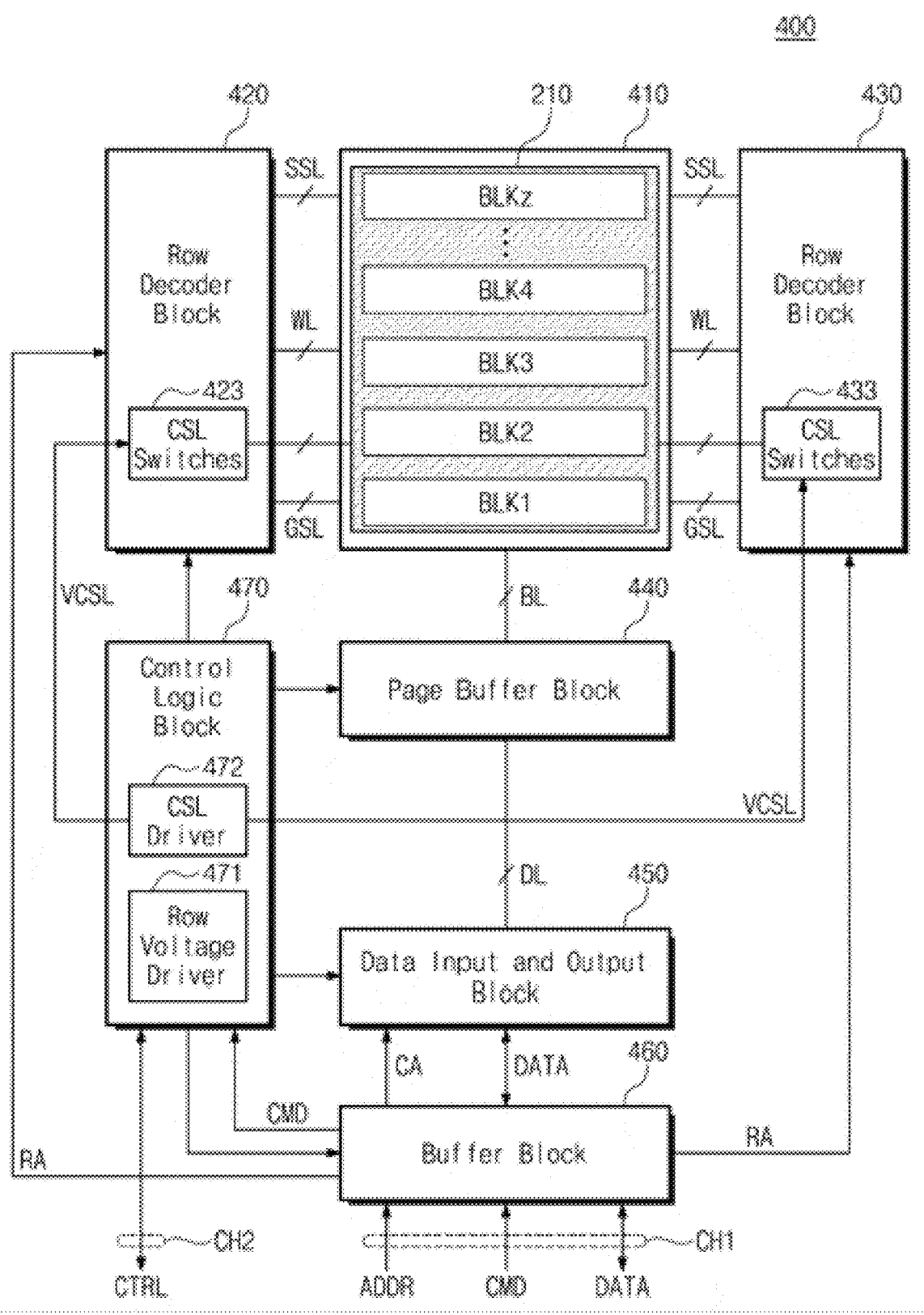
FIG. 11 is a block diagram showing a non-volatile memory device according to example embodiments of the disclosure.

FIG. 11 is a block diagram showing a non-volatile memory device according to example embodiments of the disclosure.

Referring to FIGS. 1 to 11, a non-volatile memory device 400 may include a memory cell array 410, a first row decoder block 420, a second row decoder block 430, a page buffer block 440, a data input and output block 450, a buffer block 460, and/or a control logic block 470.

The memory cell array 410 may include a plurality of memory blocks BLK1 to BLKz on a common source plate 210. Each memory block may include at least one cell structure 220. Each cell structure 220 may include a plurality of memory cells. The memory cell array 410 may be embodied in a memory cell region 200.

Each of the memory blocks BLK1 to BLKz may be connected to a first row decoder block 420 and a second row decoder block 430 via at least one ground section line GSL, word lines WL, and two or more string selection lines SSL.

A part of word lines WL may be used as dummy word lines. Each memory block may be connected to the page buffer block 440 via a plurality of bit lines BL. The plurality of memory blocks BLK1 to BLKz may be connected in common to the plurality of bit lines BL.

The first row decoder block 420 may be connected to the memory cell array 410 via ground selection lines GSL, word lines WL, and string selection lines SSL. The first row decoder block 420 may operate under control of the control logic block 470.

The second row decoder block 430 may be connected to the memory cell array 410 via ground selection lines GSL, word lines WL, and string selection lines SSL. The second row decoder block 430 may operate under control of the control logic block 470.

Each of the first and second row decoder blocks 420 and 430 may decode a row address RA received from the buffer block 460, and may control voltages applied to the string selection lines SSL, the word lines WL, and the ground selection lines GSL in accordance with the decoded row address.

The first row decoder block 420 may include first common source line switches 423. The first common source line switches 423 may bias voltages to the common source plate 210. The second row decoder block 430 may include second common source line switches 433. The second common source line switches 433 may bias voltages to the common source plate 210. In accordance with example embodiments, the first common source line switches 423 and the second common source line switches 433 may be omitted.

The page buffer block 440 is connected to the memory cell array 410 via a plurality of bit lines BL. The page buffer block 440 is connected to the data input and output block 450 via a plurality of data lines DL. The page buffer block 440 operates under control of the control logic block 470.

In a write operation, the page buffer block 440 may store data to be written in memory cells. The page buffer block 440 may apply voltages to the plurality of bit lines BL on the basis of the stored data. In a read operation or in verification reading of a write operation or an erase operation, the page buffer block 440 may sense voltages of the bit lines BL, and may store sensed results.

The data input and output block 450 is connected to the page buffer block 440 via the plurality of data lines DL. The data input and output block 450 may receive a column address CA from the buffer block 460. The data input and output block 450 may output data read by the page buffer block 440 to the buffer block 460 in accordance with the column address CA. The data input and output block 450 may transfer data received from the buffer block 460 to the page buffer block 440 in accordance with the column address CA.

The buffer block 460 may receive a command CMD and an address ADDR from an external device via a first channel CH1, and may exchange data DATA with the external device. The buffer block 460 may operate under control of the control logic block 470. The buffer block 460 may transfer the command CMD to the control logic block 470. The buffer block 460 may transfer a row address RA of the address ADDR to the row decoder block 420, and may transfer a column address CA to the data input and output block 450. The buffer block 460 may exchange data DATA with the data input and output block 450.

The control logic block 470 may exchange a control signal CTRL with the external device via a second channel CH2. The control logic block 470 may control the buffer block 460 to route the command CMD, the address ADDR and the data DATA. The control logic block 470 may decode the command CMD received from the buffer block 460, and may control the non-volatile memory device 400 in accordance with the decoded command.

Illustratively, the first row decoder block 420, the second row decoder block 430, the page buffer block 440, the data input and output block 450, the buffer block 460, and/or the control logic block 470 may be embodied in the peripheral circuit region 100.

The first row decoder block 420 or at least a part of the first row decoder block 420 may be embodied in the first exposed region 120. The second row decoder block 430 or at least a part of the second row decoder block 430 may be embodied in the second exposed region 130. The buffer block 460 or at least a part of the buffer block 460 may be embodied in the third exposed region 140.

The control logic block 470 may include a row voltage driver 471 and a common source line (CSL) driver 472. The row voltage driver 471 may generate various voltages to be applied to the string section lines SSL, the word lines WL, and the ground selection lines GSL, and may transfer the generated voltages to the first row decoder block 420 and the second row decoder block 430.

The common source line driver 472 may generate various common source line voltages VCSL to be applied to the common source plate 210, and may transfer the generated common source line voltages VCSL to the first common source line switches 423 and the second common source line switches 433.

Figure 12:
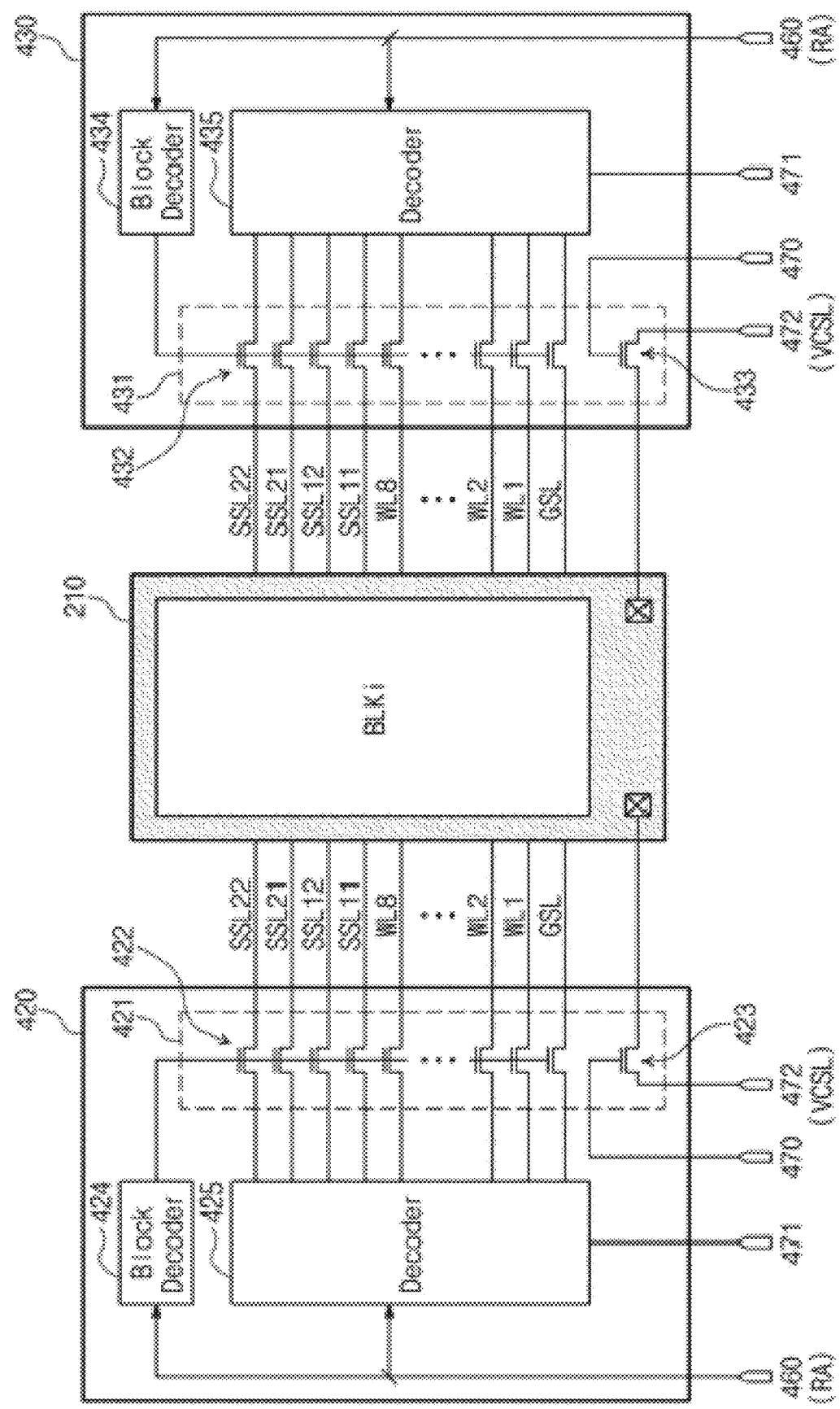
FIG. 12 is a block diagram showing a part of constituent elements of decoder blocks corresponding to one memory block in FIG. 11.

FIG. 12 is a block diagram showing a part of constituent elements of decoder blocks corresponding to one memory block in FIG. 11.

Referring to FIGS. 1 to 12, the first row decoder block 420 may include a transistor array 421, a block decoder 424, and/or a decoder 425.

The transistor array 421 may include a plurality of transistors. From among the plurality of transistors, the transistors connected to the ground selection line GSL, the first to eighth word lines WL1 to WL8, and the eleventh to twenty-second string selection lines SSL11, SSL12, SSL21 and SSL22 may be pass transistors 422.

The pass transistors 422 may simultaneously turn on or off in response to control of the block decoder 424. Each of the pass transistors 422 may transfer a voltage transferred from the decoder 425 to a memory block BLKi via a corresponding line.

From among the plurality of transistors, the transistor (transistors) transferring a voltage to the common source plate 210 may be a common source line switch 423. The common source line switch 423 may turn on or off in response to control of the control logic block 470. The common source line switch 423 may apply, to the common source plate 210, common source line voltages VCSL received from a common source line driver 472 of the control logic block 470.

The block decoder 424 may receive a block address, indicating a memory block BLKi, of a row address RA from the buffer block 460. When the block address indicates the memory block BLKi, the block decoder 424 may turn on the pass transistors 422. When the block address does not indicate the memory block BLKi, the block decoder 424 may turn off the pass transistors 422.

The decoder 425 may receive a ground selection line voltage, a word line selection voltage, word line non-selection voltages, string selection voltages, and string non-selection voltages from the row voltage driver 471 of the control logic block 470. In addition, the decoder 425 may receive the remaining address of the row address RA, except for the block address, from the buffer block 460.

The decoder 425 may apply the ground selection line voltage to the pass transistor 422 connected to the ground selection line GSL. The decoder 425 may apply the word line selection voltage to the pass transistor 422 connected to the word line indicated by the remaining address from among the word lines WL1 to WL8, and may apply the word line non-selection voltages to the pass transistors 422 connected to the remaining word lines, respectively.

The decoder 425 may apply the string selection voltages to the pass transistors 422 connected to the string selection lines indicated by the remaining address from among the string selection lines SSL11, SSL12, SSL21 and SSL22. The decoder 425 may apply the string non-selection voltages to the pass transistors 422 connected to the string selection lines not indicated by the remaining address from among the string selection lines SSL11, SSL12, SSL21 and SSL22.

The second row decoder block 430 may include a transistor array 431, a block decoder 434, and/or a decoder 435. The transistor array 431 may include pass transistors 432 and a common source line switch 433. The second row decoder block 430 may have the same structure as the first row decoder block 420, and may operate in the same manner as the first row decoder block 420. Accordingly, no overlapping description will be given.

Illustratively, the first row decoder block 420 and the second row decoder block 430 may be disposed in the first exposed region 120 and the second exposed region 130, respectively. In another example, at least parts of the first row decoder block 420 and the second row decoder block 430, for example, the transistor arrays 421 and 431, may be disposed in the first exposed region 120 and the second exposed region 130, respectively.

The common source line driver 472, which applies the common source line voltages VCSL to the common source plate 210 via the common source line switches 423 and 433, may be disposed in the buried region 110. The common source line switches 423 and 433 may be described as being parts of the first row decoder block 420 and the second row decoder block 430 in that the common source switches 423 and 433 are densely disposed together with the pass transistors 422 and 432. However, the common source line switches 423 and 433 may also be understood as being constituent elements distinguished from the first row decoder block 420 and the second row decoder block 430.

In accordance with example embodiments of the disclosure, efficiency of an output voltage versus an input voltage in a pass transistor may be enhanced.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments of the disclosure have been described with reference to the accompanying drawings, it should be understood by those skilled in the art that various modifications may be made without departing from the scope of the disclosure and without changing essential features thereof. Therefore, the above-described example embodiments should be considered in a descriptive sense only and not for purposes of limitation.

What is claimed is:

1. A non-volatile memory device comprising:
a memory cell region including a plurality of cell transistors;
a first type semiconductor substrate including a peripheral circuit region including circuits configured to control the plurality of cell transistors; and
a plurality of pass transistors on the peripheral circuit region of the first type semiconductor substrate, wherein
the peripheral circuit region includes a first region and a second region which are doped to a depth at an upper portion of the first type semiconductor substrate while being insulated from each other by an implant region,
the first region is a second type different from the first type, and includes a first doped region, and a first well region beneath the first doped region and configured to have a higher doping concentration than the first doped region,
the second region is the first type, and includes a second doped region, and a second well region beneath the second doped region and configured to have a higher doping concentration than the second doped region,
a first pass transistor on the first region from among the plurality of pass transistors is connected to a string selection line or a ground selection transistor,
a second pass transistor on the second region from among the plurality of pass transistors is connected to a word line,
a first contact extends through the first doped region and contacts the first well region, wherein the first contact is surrounded by and laterally contacts the first doped region, and a second contact extends through the second doped region and contacts the second well region, wherein the second contact is surrounded by and laterally contacts the second doped region, and
the first well region is configured to receive a first voltage via the first contact while a first input voltage is being applied to the first pass transistor, the second well region is configured to receive a second voltage via the second contact while a second input voltage is being applied to the second pass transistor, and a level of the first voltage and a level of the second voltage are different from a ground voltage level.

2. The non-volatile memory device according to claim 1, wherein the second contact is configured to supply a voltage signal to the second well region.

3. The non-volatile memory device according to claim 1, wherein a voltage of 20 V or more is configured to be applied to the plurality of pass transistors.

4. The non-volatile memory device according to claim 1, wherein:
the first type is a P type; and
the second type is an N type.

5. The non-volatile memory device according to claim 4, wherein:
the first pass transistor is a PMOS transistor; and
the second pass transistor is an NMOS transistor.

6. The non-volatile memory device according to claim 4, wherein:
the first well region is the second type; and
the second well region is the first type.

7. The non-volatile memory device according to claim 4, wherein the implant region is the second type.

8. The non-volatile memory device according to claim 1, wherein the implant region includes a side wall region surrounding a side surface of each of the first region and the second region, and a deep well region surrounding a bottom surface of each of the first region and the second region.

9. The non-volatile memory device according to claim 8, wherein the first well region and the second well region are directly on the deep well region.

10. The non-volatile memory device according to claim 8, wherein the side wall region includes a region between the first region and the second region.

11. The non-volatile memory device according to claim 1, wherein a positive voltage and a negative voltage are configured to be applied to the implant region.

12. The non-volatile memory device according to claim 11, wherein a voltage level of a voltage signal configured to be applied to the second well region is not higher than a voltage level of an input voltage signal of the second pass transistor.

13. The non-volatile memory device according to claim 11, wherein a voltage identical to the voltage configured to be applied to the second well region is configured to be applied to the implant region.

14. The non-volatile memory device according to claim 13, wherein a ground voltage is configured to be applied to the first type semiconductor substrate.

15. The non-volatile memory device according to claim 1, wherein:
the peripheral circuit region further includes a third region insulated from the first region and the second region by the implant region;
the second region is between the first region and the third region;
the first pass transistor on the first region from among the plurality of pass transistors is connected to the string selection line; and
a third pass transistor on the third region from among the plurality of pass transistors is connected to the ground selection transistor.

16. The non-volatile memory device according to claim 15, wherein the implant region includes a side wall region between the second region and the third region.

17. A non-volatile memory device comprising:

a memory cell array including a plurality of memory blocks; and a row decoder block connected to the plurality of memory blocks via a ground selection line, a word line and a string selection line, wherein the row decoder block includes a semiconductor substrate, a first pass transistor on a first region of the semiconductor substrate and connected to the ground selection line, a second pass transistor on a second region of the semiconductor substrate and connected to the word line, and a third pass transistor on a third region of the semiconductor substrate and connected to the string selection line, each of the first region, the second region, and the third region is a region doped to a depth from a top surface of the semiconductor substrate, the first region, the second region, and the third region are insulated from one another by an implant region at the semiconductor substrate, the implant region includes a side wall region surrounding a side wall of each of the first region, the second region and the third region, and a deep well region surrounding a bottom surface of each of the first region, the second region and the third region, the first region includes a first doped region and a first well region doped beneath the first doped region, the first well region having a higher concentration than the first doped region, the second region includes a second doped region and a second well region doped beneath the second doped region, the second well region having a higher concentration than the second doped region, a first contact extends through the first doped region and contacts the first well region, wherein the first contact is surrounded by and laterally contacts the first doped region, and a second contact extends through the second doped region and contacts the second well region, wherein the second contact is surrounded by and laterally contacts the second doped region, and the first well region is configured to receive a first voltage via the first contact while a first input voltage is being applied to the first pass transistor, the second well region is configured to receive a second voltage via the second contact while a second input voltage is being applied to the second pass transistor, and a level of the first voltage and a level of the second voltage are different from a ground voltage level.

18. The non-volatile memory device according to claim 17, wherein:

the side wall region is on the deep well region; and the side wall and the bottom surface of each of the first region, the second region and the third region are completely surrounded by the implant region.

19. The non-volatile memory device according to claim 17, wherein:

the implant region is a region doped in a concentration;

the second region is between the first region and the third region; and the side wall region is between the first region and the second region and between the second region and the third region.

20. A non-volatile memory device comprising:

a memory cell array including a plurality of memory blocks; and a row decoder block connected to the plurality of memory blocks via a ground selection line, a word line, a dummy word line and a string selection line, wherein the row decoder block includes a semiconductor substrate, a first pass transistor on a first region of the semiconductor substrate and connected to the ground selection line, a second pass transistor on a second region of the semiconductor substrate and connected to the word line or the dummy word line, and a third pass transistor on a third region of the semiconductor substrate and connected to the string selection line, each of the first region, the second region, and the third region is a region doped to a depth from a top surface of the semiconductor substrate, the semiconductor substrate includes a side wall region surrounding a side wall of each of the first region, the second region and the third region, and a deep well region surrounding a bottom surface of each of the first region, the second region and the third region, an implant region is a region doped in a concentration, and insulates the first region, the second region and the third region from one another, the first region includes a first doped region and a first well region doped beneath the first doped region, the first well region having a higher concentration than the first doped region, the second region includes a second doped region and a second well region doped beneath the second doped region, the second well region having a higher concentration than the second doped region, a first voltage signal having a lower level than a first input voltage signal of the first pass transistor is configured to be applied to the first well region via a first contact extending through the first doped region, wherein the first contact is surrounded by and laterally contacts the first doped region, and a second voltage signal having a lower level than a second input voltage signal of the second pass transistor is configured to be applied to the second well region via a second contact extending through the second doped region, wherein the second contact is surrounded by and laterally contacts the second doped region.

* * * * *